(12) United States Patent
Xu et al.

(10) Patent No.: US 7,282,765 B2
(45) Date of Patent: Oct. 16, 2007

(54) POWER LDMOS TRANSISTOR

(75) Inventors: Shuming Xu, Schnecksville, PA (US); Jacek Korec, Sunrise, FL (US)

(73) Assignee: Ciclon Semiconductor Device Corp., Bethlehem, PA (US)

( * ) Notice: Subject to any disclaimer, the term of this patent is extended or adjusted under 35 U.S.C. 154(b) by 141 days.

(21) Appl. No.: 11/180,155

(22) Filed: Jul. 13, 2005

(65) Prior Publication Data
US 2007/0013008 A1 Jan. 18, 2007

(51) Int. Cl.
*H01L 29/76* (2006.01)
*H01L 29/94* (2006.01)
*H01L 31/00* (2006.01)

(52) U.S. Cl. .................... 257/343; 257/409
(58) Field of Classification Search ............. 257/384, 257/343, 409
See application file for complete search history.

(56) References Cited

U.S. PATENT DOCUMENTS

| | | | |
|---|---|---|---|
| 4,455,565 A | 6/1984 | Goodman et al. | |
| 4,754,310 A | 6/1988 | Coe | |
| 5,155,563 A | 10/1992 | Davies et al. | |
| 5,216,275 A | 6/1993 | Chen | |
| 5,252,848 A | 10/1993 | Adler et al. | |
| 5,841,166 A | 11/1998 | D'Anna et al. | |
| 5,907,173 A | 5/1999 | Kwon et al. | |
| 5,912,490 A | 6/1999 | Hebert et al. | |
| 5,949,104 A | 9/1999 | D'Anna et al. | |
| 6,001,710 A | 12/1999 | Francois et al. | |
| 6,063,678 A * | 5/2000 | D'Anna | 438/301 |
| 6,181,200 B1 * | 1/2001 | Titizian et al. | 330/66 |
| 6,215,152 B1 | 4/2001 | Hebert | |
| 6,372,557 B1 | 4/2002 | Leong | |
| 6,521,923 B1 | 2/2003 | D'Anna et al. | |
| 6,600,182 B2 | 7/2003 | Rumennik | |
| 6,653,740 B2 | 11/2003 | Kinzer et al. | |
| 6,677,641 B2 | 1/2004 | Kocon | |
| 6,720,618 B2 | 4/2004 | Kawaguchi et al. | |
| 6,831,332 B2 | 12/2004 | D'Anna et al. | |

(Continued)

OTHER PUBLICATIONS

Cheon Soo Kim et al., Trenched Sinker LDMOSFET (TS-LDMOS) Structure for High Power Amplifier Application above 2 GHz, IEEE No. 0-7803-7050-3/01, 2001, pp. IEDM 01-887—IEDM 01-890.

(Continued)

*Primary Examiner*—Richard T. Elms
*Assistant Examiner*—Allison P. Bernstein
(74) *Attorney, Agent, or Firm*—Duane Morris LLP

(57) ABSTRACT

An LDMOS device comprises a substrate having a first conductivity type and a lightly doped epitaxial layer thereon having an upper surface. Source and drain regions of the first conductivity type are formed in the epitaxial layer along with a channel region of a second conductivity type formed therebetween. A conductive gate is formed over a gate dielectric layer. A drain contact electrically connects the drain region to the substrate, comprising a first trench formed from the upper surface of the epitaxial layer to the substrate and having a side wall along the epitaxial layer, a highly doped region of the first conductivity type formed along the side wall of the first trench, and a drain plug in the first trench adjacent the highly doped region. A source contact is provided and an insulating layer is formed between the conductive gate and the source contact.

25 Claims, 10 Drawing Sheets

U.S. PATENT DOCUMENTS 6,956,239 B2 * 10/2005 Sriram .................. 257/77
2004/0021233 A1   2/2004 Kinzer et al.
2005/0017298 A1   1/2005 Xie et al.

OTHER PUBLICATIONS

Yasuhova, Matsushita et al., "Low Gate Charge 30 V N-channel LDMOS for DC-DC converters," International Symposium On Power Semiconductor Devices & ICS (15TH: 2003: Cambridge, England) (4 pages).

Xu, Baiocchi et al., "High Power Silicon RF LDMOSFET Technology for 2.1 GHZ Power Amplifier Applications," IEE Proceedings—Circuits Devices Syst. vol. 151, No. 3, Jun. 2004 pp (4 pages).

Xu, Shibib et al., "High Performance RF Power LDMOSFET Technology for 2.1 GHZ Power Amplifier Applications," Microwave Symposium Digest, 2003 IEEE MTT-S International Publication Date: Jun. 8-13, 2003 vol. 1, pp. 217-220.

* cited by examiner

M2N20_300A_1mm2
Vds=5V

POWER LDMOS TRANSISTOR

FIELD OF THE INVENTION

The present invention relates to semiconductor structures and more particularly to laterally diffused MOS transistors (LDMOS), and still more particularly to LDMOS transistors designed for low voltage power management applications.

BACKGROUND OF THE INVENTION

Power MOSFETs (metal oxide semiconductor (MOS) field effect transistors (FET)) are used as electric switches for high frequency PWM (pulse width modulation) applications such as voltage regulators and/or as load switches in power applications. When used as load switches, where switching times are usually long, cost, size and on-resistance of the switches are the prevailing design considerations. When used in PWM applications, the transistors must exhibit small power loss during switching, which imposes an additional requirement—small internal capacitances—that make the MOSFET design challenging and often times more expensive. Special attention has been paid to the Gate-to-Drain (Cgd) capacitance, as this capacitance determines the voltage transient time during switching and is the most important parameter affecting the switching power loss.

Examples of prior art laterally diffused power MOSFET devices are provided in U.S. Pat. No. 5,949,104 to D'Anna et al. and U.S. Pat. No. 6,831,332 to D'Anna et al., the entirety of which are hereby incorporated by reference herein. Both devices use thick epitaxial layers to achieve high breakdown voltage (>60V) required for the target RF applications. To minimize the parasitic source inductance in the assembly, both devices are designed on P+ substrates leading the source electrode to the back side of the die. The thick epitaxial layer and P+ substrate result in a high on resistance ($R_{ds,on}$) of the device, which is not acceptable for power management applications. Also, both device concepts lead to a stripe layout of the drain electrode. This in turn leads to a de-biasing effect known for lateral devices (voltage drop along a stripe electrode under high current conditions) and limits the current handling capability of the transistor. Further, the shield gate introduced in the U.S. Pat. No. 6,831,332 to D'Anna et al. is laterally constrained to the space between the gate and the drain electrodes and is applicable only to a stripe layout of the drain electrode.

There remains a need, therefore, for an LDMOS structure with improved device performance ($R_{ds,on}$ and Cgd) as well as improved manufacturability.

SUMMARY OF THE INVENTION

An LDMOS device is provided comprising a substrate having a first conductivity type and a lightly doped epitaxial layer thereon having an upper surface. Source and drain regions of the first conductivity type are formed in the epitaxial layer proximate the upper surface, the source and drain regions being spaced from one another and having a channel region of a second conductivity type formed therebetween in the epitaxial layer, the channel region extending under the source region. A conductive gate is formed over a gate dielectric layer formed over the channel region and partially overlapping the source and drain regions. A drain contact electrically connects the drain region to the substrate and is spaced from the channel region, comprising a first trench formed from the upper surface of the epitaxial layer to the substrate and having a side wall along the epitaxial layer, a highly doped region of the first conductivity type formed along the side wall of the first trench, and a drain plug in the first trench adjacent the highly doped region. A source contact is electrically connected to the source region and provides an electrical short between the source region and the channel region. An insulating layer is formed between the conductive gate and the source contact.

The above and other features of the present invention will be better understood from the following detailed description of the preferred embodiments of the invention that is provided in connection with the accompanying drawings.

BRIEF DESCRIPTION OF THE DRAWINGS

The accompanying drawings illustrate preferred embodiments of the invention, as well as other information pertinent to the disclosure, in which.

DETAILED DESCRIPTION

As used herein, the following dopant concentrations are distinguished using the following notations:

(a) N++ or P++: dopant concentration>$5\times10^{19}$ atoms/cm$^3$;
(b) N+ or P+: dopant concentration of $1\times10^{18}$ to $5\times10^{19}$ atoms/cm$^3$;
(c) N or P: dopant concentration of $5\times10^{16}$ to $1\times10^{18}$ atoms/cm$^3$;
(d) N− or P−: dopant concentration of $1\times10^{15}$ to $5\times10^{16}$ atoms/cm$^3$;
(e) N−− or P−−: dopant concentration<$1\times10^{15}$ atoms/cm$^3$.

Figure 1:
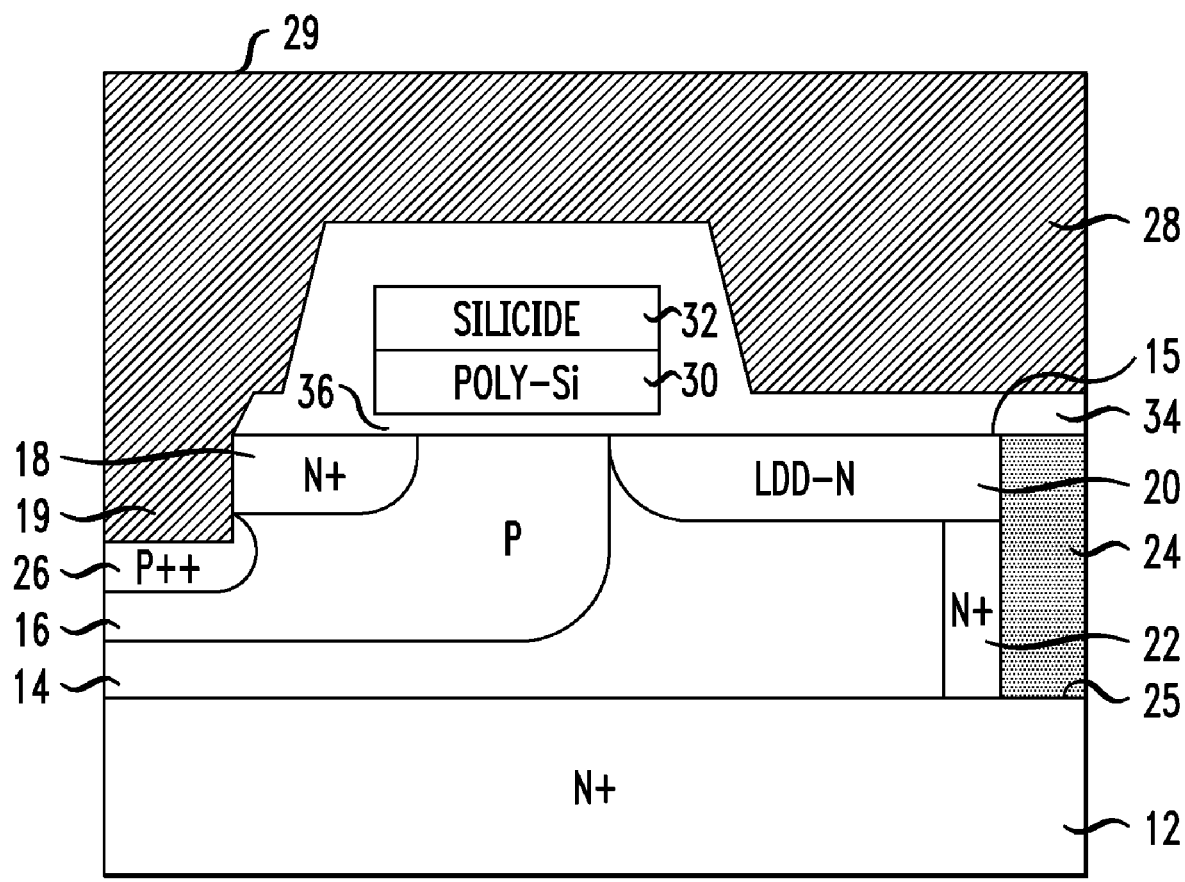
FIG. 1 is an illustration of a LDMOS transistor according to the present invention.

FIG. 1 is an illustration of an embodiment of an improved power transistor, more specifically and improved LDMOS transistor 10. In exemplary applications, the transistor 10 is used as a switch in a voltage regulator of a power supply for, for example, a server or desktop computer or in a DC/DC converter for general use.

Specifically, FIG. 1 illustrates an improved n-channel LDMOS device. The transistor structure 10 includes a semiconductor substrate 12, which, in the illustrated embodiment, is preferably a highly doped (N+) silicon wafer doped with arsenic or phosphorous, for example. Highly doped (N+) substrates have lower resistances than P+ substrates, although in alternative embodiments, the substrate 12 may be P+ doped. A drain electrode (not shown) is coupled to the bottom surface of substrate 12 when the transistor structure 10 is packaged. In an exemplary embodiment, substrate 12 has a thickness of less than or equal to about 3 mils (76.2 μm), thereby providing a very low resistance contact to the drain electrode and minimizing the contribution of the substrate to the on-resistance of the transistor. The substrate can be grinded and etched, or otherwise formed, to this desired thickness. Such processes would typically be done toward the end of the processing of the substrate wafer.

A lightly doped silicon epitaxial layer 14 is formed over the substrate 12 and has an upper surface 15. In certain embodiments, the epitaxial layer 14 can have dopants of N (arsenic or phosphorous) or P (boron) dopant type and a dopant concentration of N–, N– –, P– or P– –. In one embodiment, the epitaxial layer has a thickness between about 1.5 to 3.5 µm.

The doping of the epitaxial layer is usually much lower than the doping concentration of the implanted source/drain regions. On the other hand, in case of devices with vertical current flow, the background doping of the epitaxial layer is preferably as high as possible in order to reduce the on resistance between the drain and source (Rds,on) while being just low enough to meet the targeted breakdown voltage of the transistor. With the present device, however, the original doping of the epitaxial layer has no effect on the resistance of the device because current flows through the vertical drain contact region 22, and the doping concentration can be kept very low, below $5 \times 10^{16}$ atoms/cm$^3$, and more preferably at or below $2 \times 10^{16}$ atoms/cm$^3$, for example.

A conductive gate overlies the upper surface 15 of the epitaxial layer 14. In the embodiment illustrated in FIG. 1, the conductive gate comprises a lower doped polysilicon layer 30 with an upper silicide layer 32 formed therein or thereover by processes familiar to those in the art. Silicide layer 32 can comprise any transition metal silicide, and in exemplary embodiments is selected from the group consisting of Ti, W and Co. The conductive gate preferably has a thickness between about 0.3 to 0.6 µm and a length defined by the technology generation utilized in its fabrication, e.g., 0.8 µm, 0.5 µm, 0.35 µm. or 0.25, etc. The conductive gate is formed over a gate dielectric 36, which preferably comprises SiO$_2$ formed to a thickness between about 150 to 500 Å.

Region 20 is formed completely within epitaxial layer 14 and forms an enhanced drain drift region. The enhanced drain drift region is formed abutting or at least proximate to the upper surface 15 of layer 14 and has a dopant concentration N in the illustrated embodiment. The enhanced drain drift region 20 increases the drain-to-source breakdown voltage of the LDMOS structure 10. Drain drift region 20 has a lateral dimension between about 0.5 to 1.5 µm, and a depth of between about 0.2 to 0.4 µm. The region 20 preferably extends below (i.e., is overlapped by) the conductive gate between about 0.05 to 0.15 µm and is known as lightly doped drain (LDD) structure in the literature, such as U.S. Pat. No. 5,907,173 to Kwon et al., the entirety of which is hereby incorporated by reference herein.

The LDMOS structure 10 also includes a source implant region 18 having a conductivity N+ spaced from the enhanced drain drift region 20. Source region 18 extends laterally between about 0.5 to 0.8 µm, has a depth between about 0.15 to 0.3 µm and also partially underlies the conductive gate between about 0.05 to 0.15 µm. A body region 16 having P-type dopants and having a conductivity of P concentration is formed in epitaxial layer 14 and has a subregion between the source 18 and enhanced drain region 20, forming a channel region therebetween. The body region 16 includes source contact region 18 and body contact region 26. In exemplary embodiments, the body region 16 is formed to a depth of between about 0.5 to 1.0 µm and horizontal length between about 0.8 to 1.5 µm.

The body contact region 26 has a dopant concentration P++ greater than the concentration of the body region 16. In one embodiment, the body contact region 26 is formed at the base of a shallow trench region 19 and has a lateral dimension between about 0.1 to 0.3 µm and is formed to a depth between about 0.1 to 0.3 µm. The body contact region 26 provides for a low resistance contact between the source metal layer 28 (described in more detail below) and the body region 16. Under blocking condition where the voltage applied to the drain electrode results in a reverse bias of the body-to-drain PN-junction, the depletion layer or region is "squeezed" in the vertical direction between the contact implant 26 and the doping gradient from the substrate 12. The reduced width of the depletion layer results in a lower source-drain breakdown voltage, localizing the place where the breakdown occurs beneath the contact implant. This, in turn, defines the path for the current generated during the avalanche condition, i.e., when the electric field at the body-to-drain PN-junction is so high that it leads to a generation of minority carriers by impact ionization.

A deep trench region 25 (shown filled with a plug 24) is formed adjacent enhanced drain drift region 20 and spaced from the conductive gate. The trench 25 is formed between the upper surface 15 of the epitaxial layer 14 to the upper surface of the substrate 12. The trench enables the formation of vertical drain contact region 22 adjacent the sidewalls of trench region 25, which provides a low resistance path between the enhanced drain drift region 20 and substrate 12 (and thus the drain electrode (not shown)). In the n-channel embodiment shown in FIG. 1, the drain contact 22 has a dopant concentration N+ or higher and is formed by low angle implantation while trench 25 is open. Trench 25 is then filled with a conductive material (e.g., tungsten or doped polysilicon) or insulative material (e.g., Si$_x$O$_y$) to form plug 24. In one embodiment, drain contact 22 has a horizontal dimension into epitaxial layer 14 in the amount of about 0.4 to 0.8 µm. In other embodiments, the epitaxial layer is very thin (e.g., 1.5 µm) and there is no need to etch the trench. The drain contact is created by a diffused region(s) of first conductivity type, created by multiple implants and extending from the surface to the substrate. There is no need for a drain plug in this embodiment, as no deep trench 25 is formed.

The device 10 also includes an insulating layer 34 formed over the source implant region 18, over the conductive gate sidewalls and its upper surface, as well as over the enhanced drain drift region 20 and contact plug 24. The insulating layer preferably comprises SiO$_2$ or SiO$_x$N$_y$. It should be understood, however, that insulating layer 34 can comprise several layers of insulating materials collectively forming insulating layer 34. Insulating layer 34 is preferably formed to a thickness of at least 0.03 µm on the sidewalls of the conductive gate and at least 0.05 µm on the top surface of the conductive gate. In an exemplary embodiment, insulating layer 34 is formed to a thickness between about 0.05-0.15 µm over the drain region 20. The insulating layer insulates the drain and gate regions from the source contact layer 28, described below.

As is shown in FIG. 1, device 10 also includes a source contact layer 28, which preferably comprises conductive material selected from the group consisting of Al, Ti/Al, Ti/TiN/Al or W blanket deposited over the device such as by CVD (chemical vapor deposition) or sputtering. The source contact layer 28 is deposited to fill shallow trench 19 to provide a contact between a source electrode (not shown) and the source implant 18 as well as provide a short between the source and body regions 18, 16. Source layer 28 extends over insulation layer 34, over the conductive gate and over the drain implant region 20 and drain plug 24. In one embodiment, the source metal layer 28 has a thickness defined between the upper surface 15 of the epitaxial layer 14 and its upper surface 29 between about 1.0 to 5.0 μm.

When the device 10 is turned "on," the conduction current flows through the source metal 28, laterally through the channel underneath the gate to the drain contact region 20 and then vertically along the vertical, highly doped drain contact 22 though the substrate 12 to the drain electrode (not shown) placed at the bottom side of the device 10.

The source contact structure 28 of FIG. 1 provides several advantages. First, a single layer of metal can serve as a source contact and a shield electrode, which shields the conductive gate from the drain contact 22 and reduces the capacitance between the gate and drain (Cgd). There is no need to form a separate shield gate nor is there a need to separately connect the shield gate to the source. The manufacturability of the device is thereby greatly improved.

Further, the drain-source resistance (Rsd) is optimized by the use of an N+ substrate. As those in the art will recognize, n-channel devices designed for RF applications are typically formed on P+ substrates because it is important to have the source electrode at ground potential at the bottom of the die. Although n-channel devices may be preferred for their lower channel resistance compared to p-channel devices, the p-doped substrates of the prior art provide much higher resistances than n-substrates, often 2 to 3 times higher. The present device 10, however, provides an n-channel device on a low resistance n-doped substrate.

An exemplary method of forming device 10 is now described. Certain details which will be readily apparent to those in the art are eliminated so as to avoid obscuring the present invention. Substrate 12 is provided with a predefined N+ dopant concentration. Epitaxial layer 14 having dopant concentration of N− or P− is next formed over the upper surface of the substrate 12. A first trench is etched through the epitaxial layer after depositing and patterning of a thin oxide layer used as a dedicated drain contact mask. The side walls of the trench are N+ doped with a 7 degree implant of a suitable dopant, preferably Phosphorous or Arsenic, to form the drain contact regions. The first trench is filled with a material to form the drain plug. In one embodiment, the trench is filled with N+ doped polysilicon. Next, the polysilicon is etched back to a level slightly below the surface of the epitaxial layer and the oxide mask is removed.

After forming the drain contact and plug regions in the epitaxial layer 14, a thin gate oxide layer is formed over the upper surface 15 of the epitaxial layer. Next, a layer of polysilicon is deposited and etched to form a polysilicon gate. Silicide layer 32 is then formed using the well know salicide process or a silicide layer is deposited over the polysilicon layer and etched therewith to form the stacked polysilicon/silicide structure shown in FIG. 1. Following the formation of silicide layer 32, P-body or N-enhanced drift regions are formed by masked implantation of respective dopants and thermal diffusion steps. The side spacers adjacent the conductive gate can be separately formed using a known side wall spacer process if necessary. For example, an oxide layer can be deposited and etched back with an anisotropic reactive ion etch (RIE). The N+ source region is formed by implantation of Arsenic using a patterned photoresist as a mask.

Next, shallow trench 19 is patterned and etched to the desired depth, followed by formation of implant region 26. An oxide layer 34 is deposited over the upper surface 15 and conductive gate to the desired thickness. Finally, a metal layer is deposited over the entire structure to form source contact 28. The original substrate is then thinned to a desired thickness and a backside metal (not shown) is deposited to from the drain electrode. The device is then packaged and tested.

Figure 2:
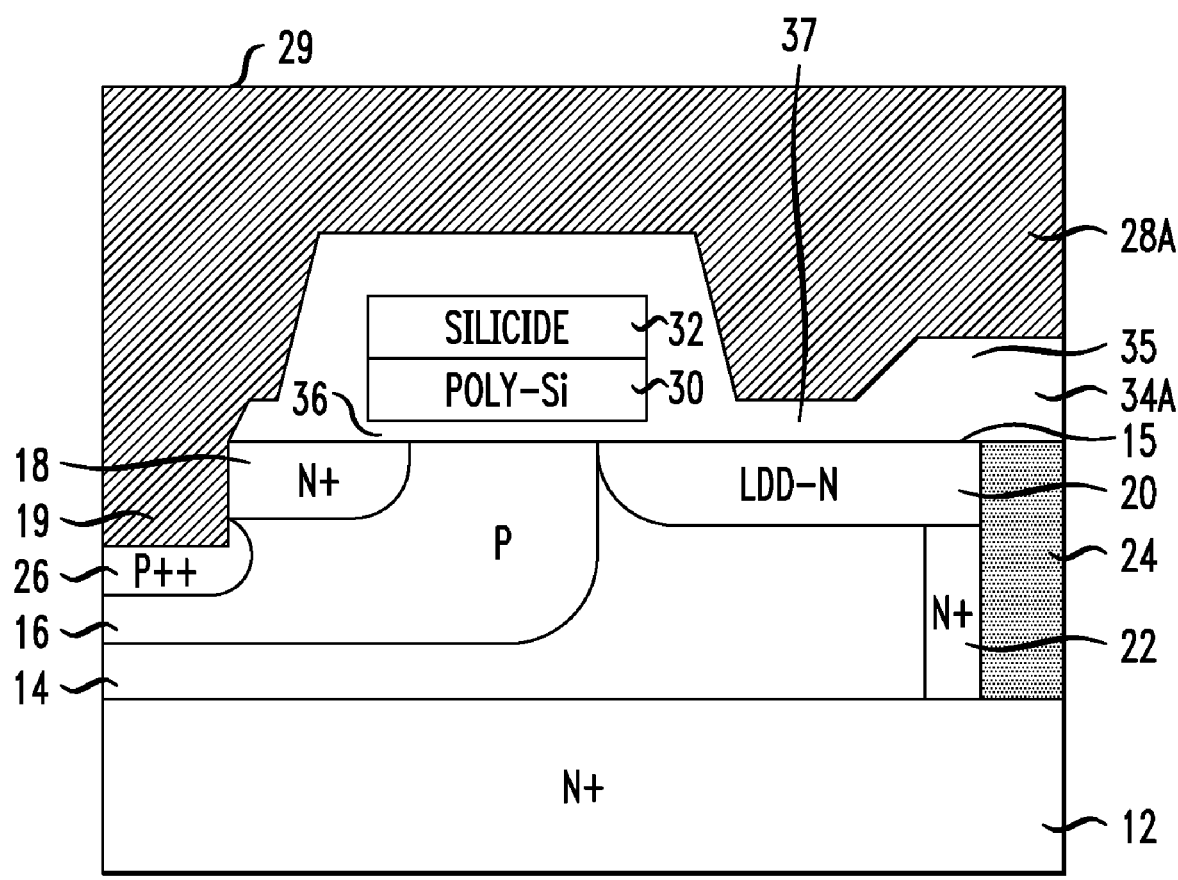
FIG. 2 is an illustration of an embodiment of a LDMOS transistor of the present invention having improved field plate effect.

FIG. 2 illustrates a second embodiment 10A of the improved LDMOS device. The device 10A is identical in all respects to the device 10 of FIG. 1, and like features are identified by like reference numbers, except for modified insulation layer 34A and modified source metal layer 28A. It should be understood that source metal layer 28A is modified only in so much as it is deposited over modified insulation layer 34A. In the regions proximate to the drain implant region 20 and drain plug 24, modified insulation layer 34A has two thicknesses. More specifically, modified insulation layer 34A has a thicker region designated generally at 35 formed over drain plug 24 and parts of drain region 20 and a thinner portion 37 formed over drain region 20 and between the thicker portion 35 and the gate. In one embodiment, the length of the thin oxide region 37 amounts to about ½ to ¾ of the distance between the gate 30 and the drain plug 24. In an exemplary embodiment, the thickness of thinner portion 37 is between about 0.05-0.15 μm and the thickness of the thicker portion 35 is between about 0.2-0.5 μm. The improved insulation layer 34A can be formed first by etching a thicker, oxide layer deposited after the formation of the drain plug region. The thin oxide region 37 is deposited after gate formation and its thickness is adds to the final thickness of the region 34A, including portion 35.

In the embodiment of FIG. 2, not only does the source metal layer 28A provide a contact to the source and body regions and a shield between the gate and the drain contact, it provides for better optimization of the field plate effect. The thin oxide region 37 makes the field plate effect very effective at the gate corner by pushing the depletion layer away from the PN-junction between the body region 16 and the drain 20. If the thin oxide were to extend laterally to cover all of the drain region 20 and the drain plug 24, a high electric field peak would be located at the N–N+ drain contact corner. Making the oxide thicker at 35 relieves the electric field between the source metal and the drain contact region 22. The doping and the length of the drain region underneath the field plate, the position of the oxide step and the oxide thickness can be optimized for a given breakdown voltage target. As an example, the design of this portion of the transistor can be as follows for a target breakdown voltage of 20V:

total gate to drain plug distance 0.8-1.2 μm;
length of the thin oxide region 0.5-0.8 μm;
thickness of the thin oxide region 0.06-0.1 μm;
thickness of the thick oxide region 0.2-0.3 μm; and
the dose and the energy of the LDD implant $5 \times 10^{12}$ to $7 \times 10^{12}$ atoms/cm$^2$ and 80 to 150 keV.

Figure 3:
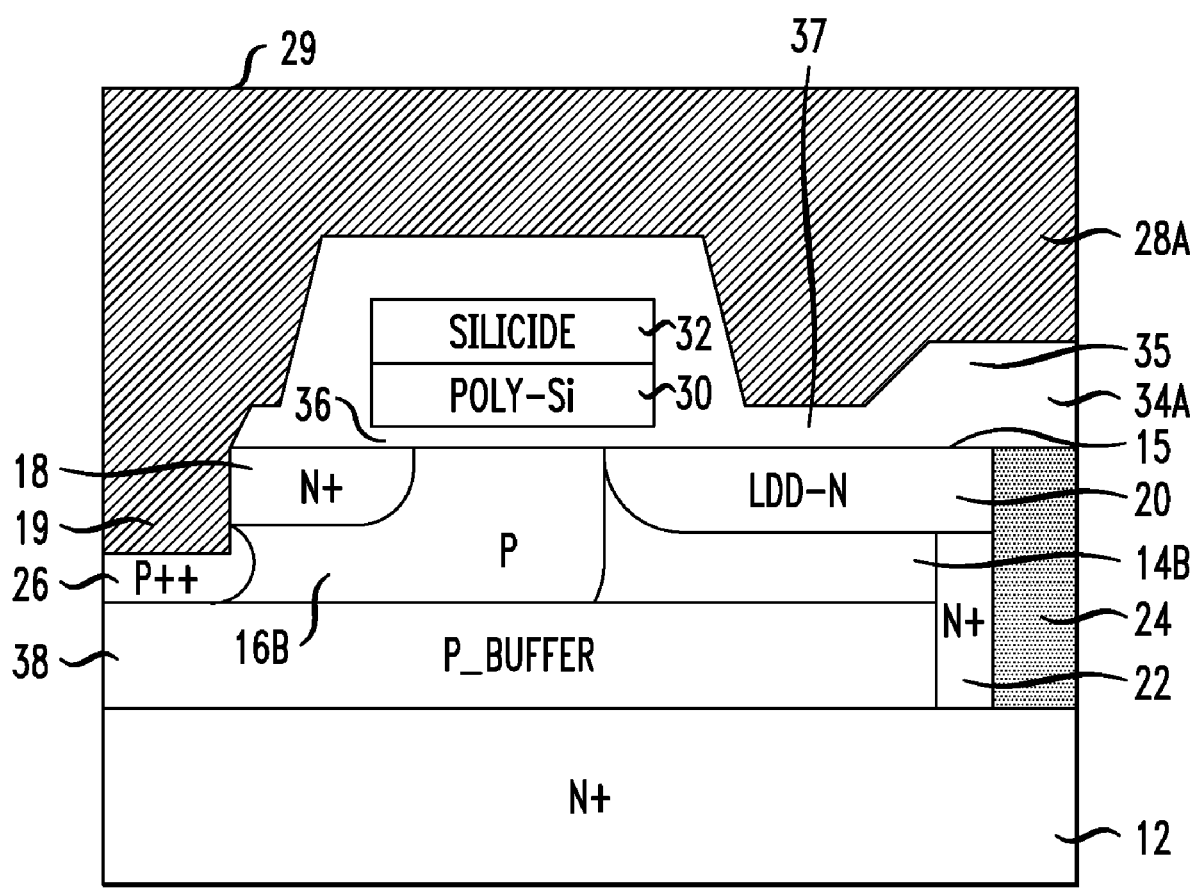
FIG. 3 is an illustration of an embodiment of a LDMOS transistor of the present invention having a buffer layer for suppressing short channel effects.

FIG. 3 illustrates another alternative embodiment 10B of the LDMOS device of either FIG. 1 or FIG. 2. The device 10B of FIG. 3 is identical to the devices 10, 10A except in the following respects: the depth of body implant region 16B is reduced and first buffer region 38 is provided between body region 16B and substrate 12. In an exemplary embodiment, first buffer region 38 comprises a layer of silicon doped with p-dopants at a concentration equal to or greater than the dopant concentration of the body region 16B. The buffer layer 38 abuts the sidewalls of vertical drain contact 22, and is preferably formed to a thickness between about 0.3 to 0.6 μm. In one embodiment, the buffer layer 38 is formed by deep implantation of Boron into the epitaxial layer 14. In the embodiment 10B from FIG. 3, this deep implantation is performed after the patterning of the thick oxide 34A, before the formation of the gate. The buffer layer 38 serves to suppress the well documented short channel effects by helping to ensure that the depletion region does not reach too far into the channel.

In the embodiment of FIG. 3, the breakdown location is still dependent in part on the thickness of epitaxial layer 14 and on the doping concentration of the substrate 12. Turning to the embodiment 10C of FIG. 4, the buffer layer 38 is replaced with thinner p-buffer layer 38C and second buffer layer 40 having dopant concentration N. In this double deep implant buffer construction, the breakdown location is advantageously located at or around the P-N junction between buffer layer 38C and buffer layer 40, making the breakdown location largely independent of the thickness of the epitaxial layer and the dopant concentration of the substrate 12. The deep implantation of N dopants (preferably Phosphorous) to form the second buffer layer 40 is performed at the beginning of the process flow, after the deposition of the epitaxial layer 14.

Figure 4:
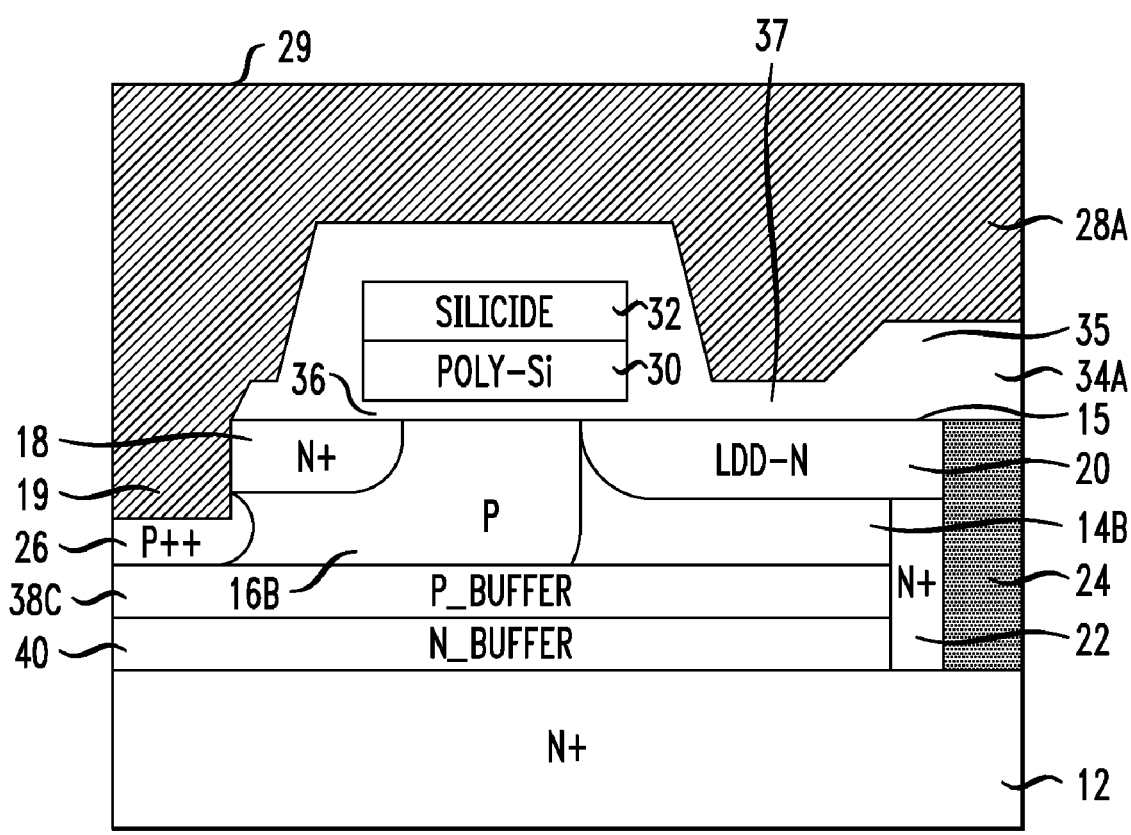
FIG. 4 is an illustration of an embodiment of a LDMOS transistor of FIG. 3 having a second buffer layer for improving the breakdown characteristics of the improved transistor.
Figure 5:
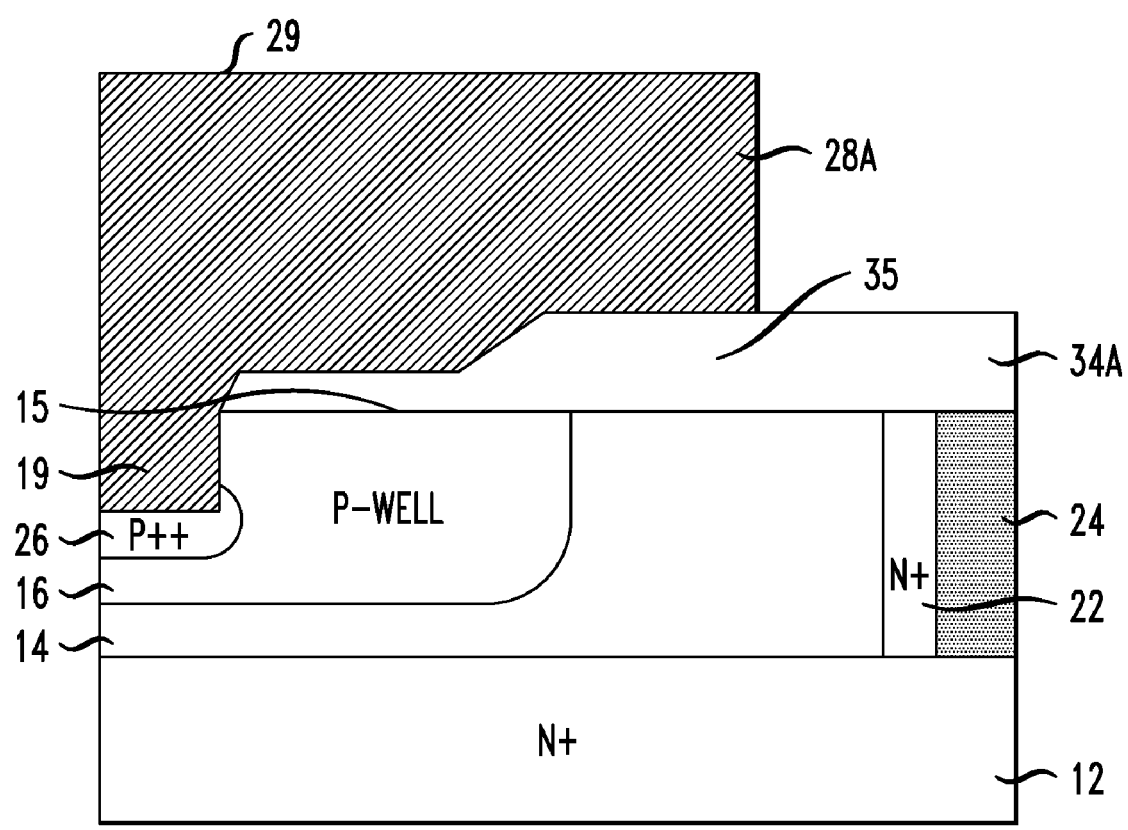
FIG. 5 is an illustration of a region proximate to a side edge of a semiconductor substrate having the improved LDMOS transistor formed thereon.

FIG. 5 illustrates the edge termination at the peripheral cells of the device of FIG. 2, so no gate is shown. The structure of the edge termination is important from a design perspective because it closes the P-N junction in a manner assuring the target breakdown voltage. The illustrated edge termination region surrounds the active area of the transistor (s) created by P-well 16. It should be understood that a single die can have a plurality of identical transistor cells as described above fabricated in parallel and operating as a single transistor in, for example, a power switch. The source metal 28A extends beyond the P-well 16 and acts as a field plate (which affects the breakdown voltage in this region of the device), as described above in connection with FIG. 2. The insulation layer underneath the field plate portion of layer 28A (again illustrated by reference number 35) has a thickness between about 0.2-0.5 μm like thicker oxide portion 35 of insulation layer 34A shown in FIGS. 2-4. The drain plug 24 is formed at, or proximate to, the edge of the singulated die having the transistor formed therein, i.e., the die is singulated from adjacent dies on a wafer at or proximate to the drain plug 24. The edge termination region ends with drain plug 24 separating the transistor from the edge of the singulated die. This illustrated structure is the natural consequence of the formation of the structure of FIG. 2.

In a preferred embodiment, the background doping of the epitaxial layer is $1\times10^{16}$ atoms/cm$^3$, the P-well 16 is formed by overlapping deep buffer 38 and body 16 implantations and the distance between the P-well and the drain plug is 1.5 μm. This edge termination can support breakdown voltages higher than 35V.

In an exemplary application, the improved power LDMOS device is fabricated in parallel with a plurality of other similarly structured devices and packaged for use as a power transistor in, for example, a DC/DC voltage regulator.

Figure 6:
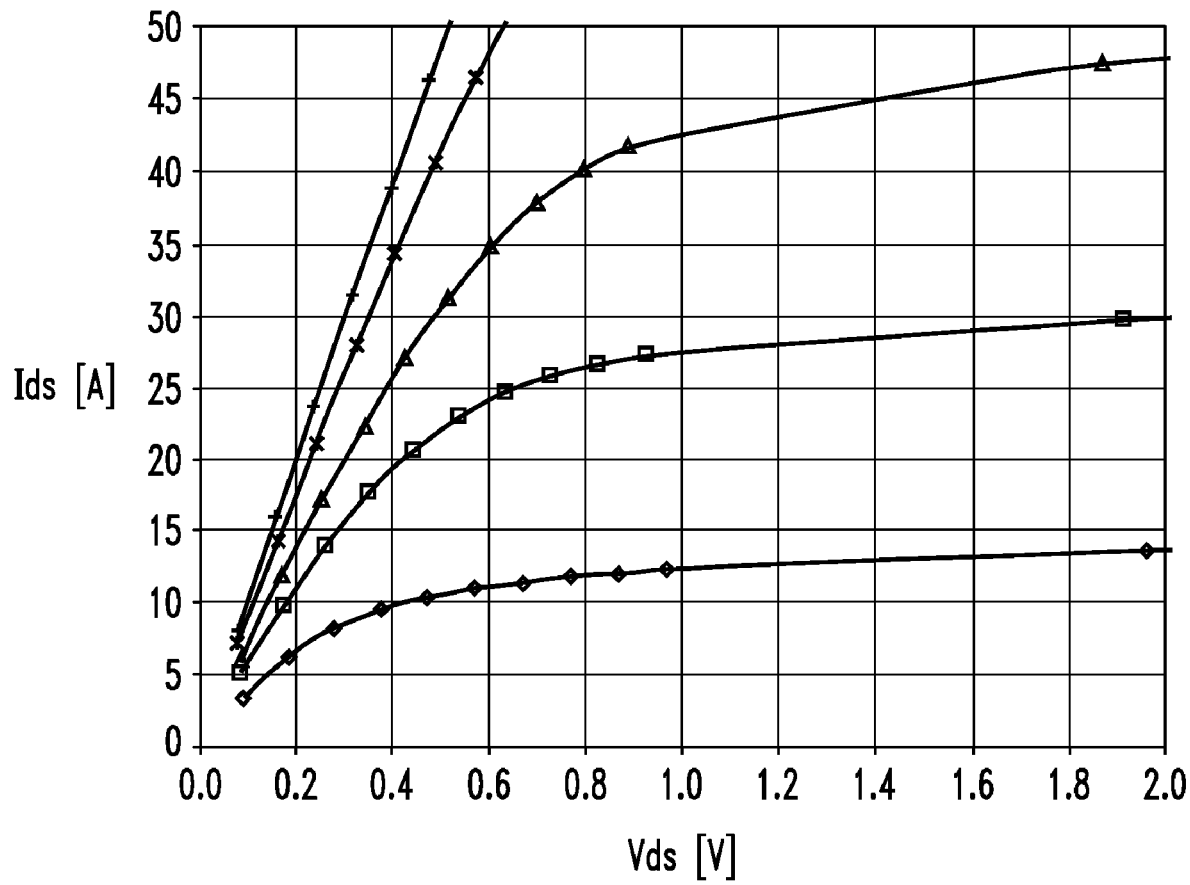
FIGS. 6-10 show electrical characteristics of the improved power LDMOS device obtained by numeric simulation.

FIGS. 6-10 show electrical characteristics obtained by numeric simulation of a 20V device 10 of FIG. 4 with an active area of 1 mm$^2$ designed for a maximum breakdown voltage of 20V and a maximum allowed source-to-gate voltage of 12V, with a gate thickness of 300 Å. FIG. 6 shows drain current as a function of the drain voltage at Vgs equal to 2.0, 2.5, 3.0, 4.0 and 5.0 volts. The flat Ids curve in saturation region (Vds>1V) shows the transistor is free of short channel effects.

Figure 7:
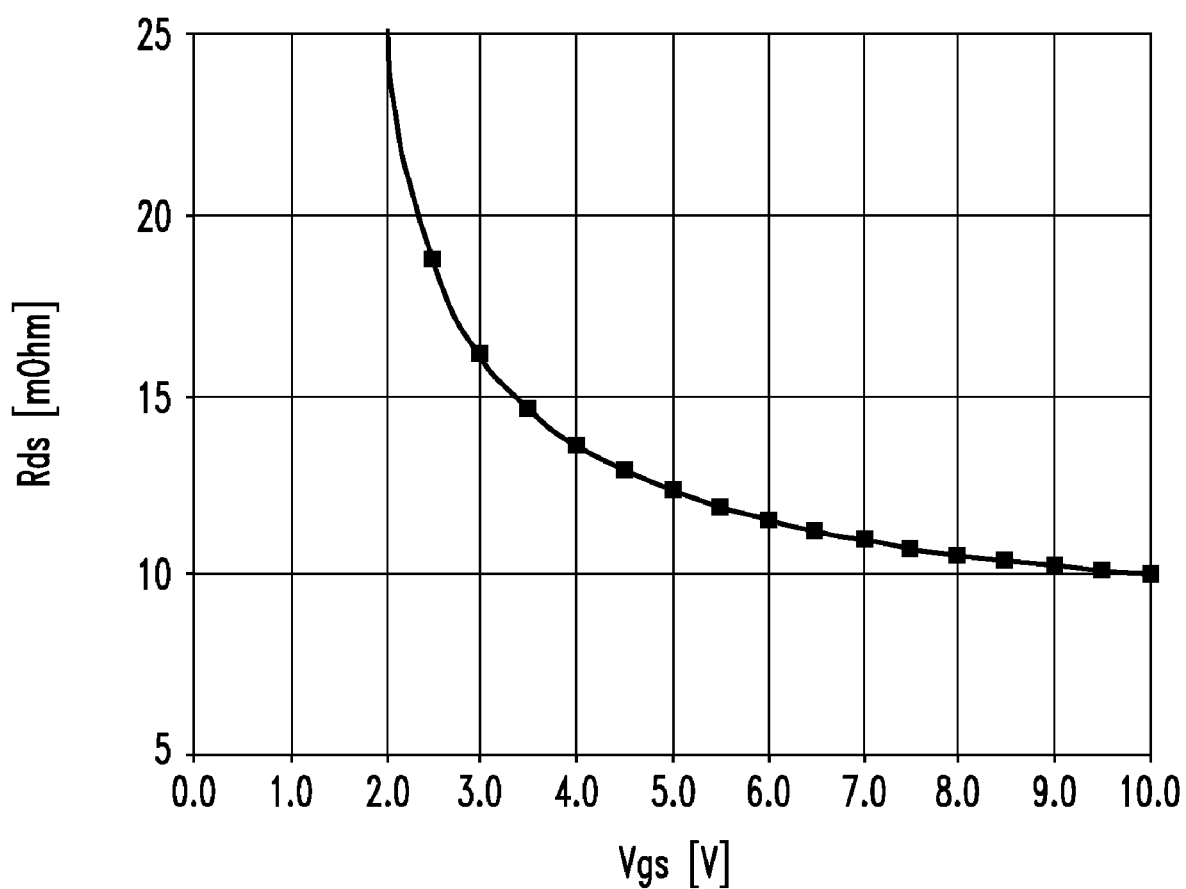

FIG. 7 shows the resistance of a device with an active area of 1 mm$^2$ calculated as a function of the gate voltage for the drain voltage of 0.1V. It can be seen that the resistance predicted for Vgs equal to 4.5V is about 13 mΩ*mm$^2$, whereas the resistance of similar devices in the art is higher than 20 mΩ*mm$^2$.

Figure 8:
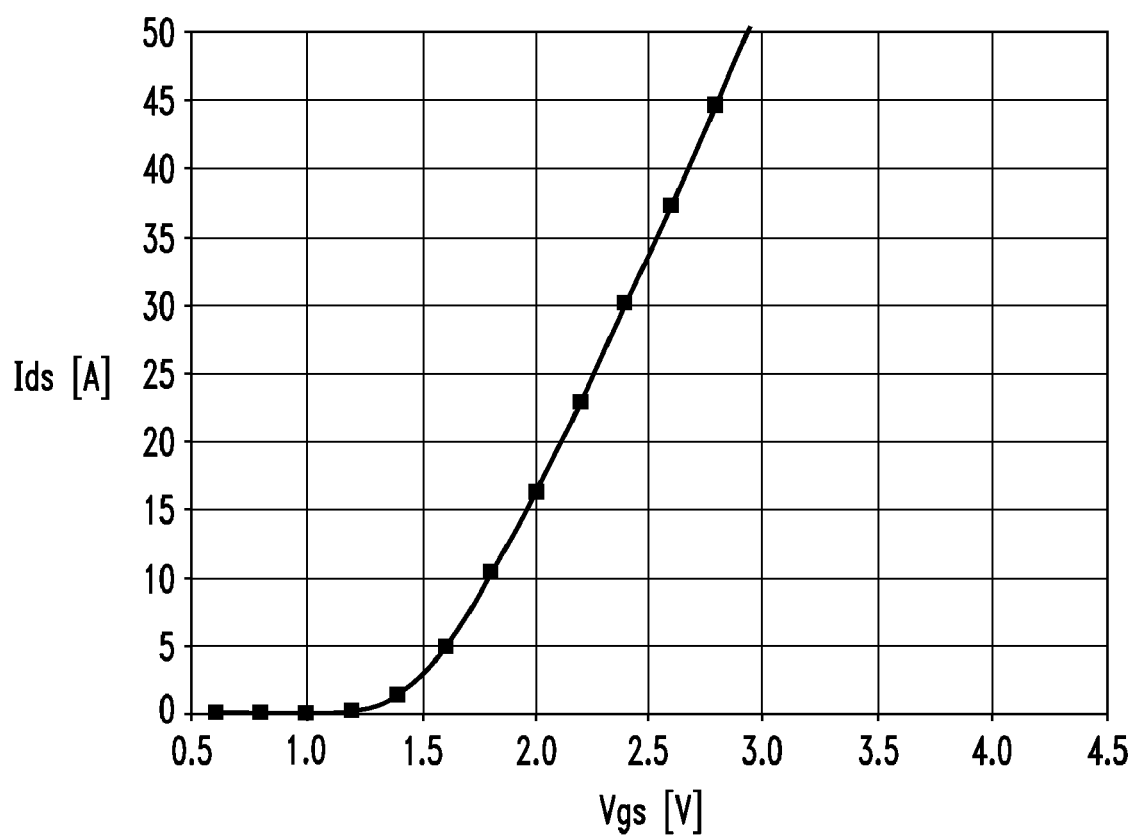

FIG. 8 shows the drain current as a function of the gate voltage for a drain voltage of 5V. It can be seen that the threshold voltage of the transistor is kept at a low value below 1.5V, which is advantageous for power applications. In contrast, modern power MOSFETs with short channel lengths usually result in a much higher threshold voltage of more than 2.2V to keep the device free of short channel effects.

Figure 9:
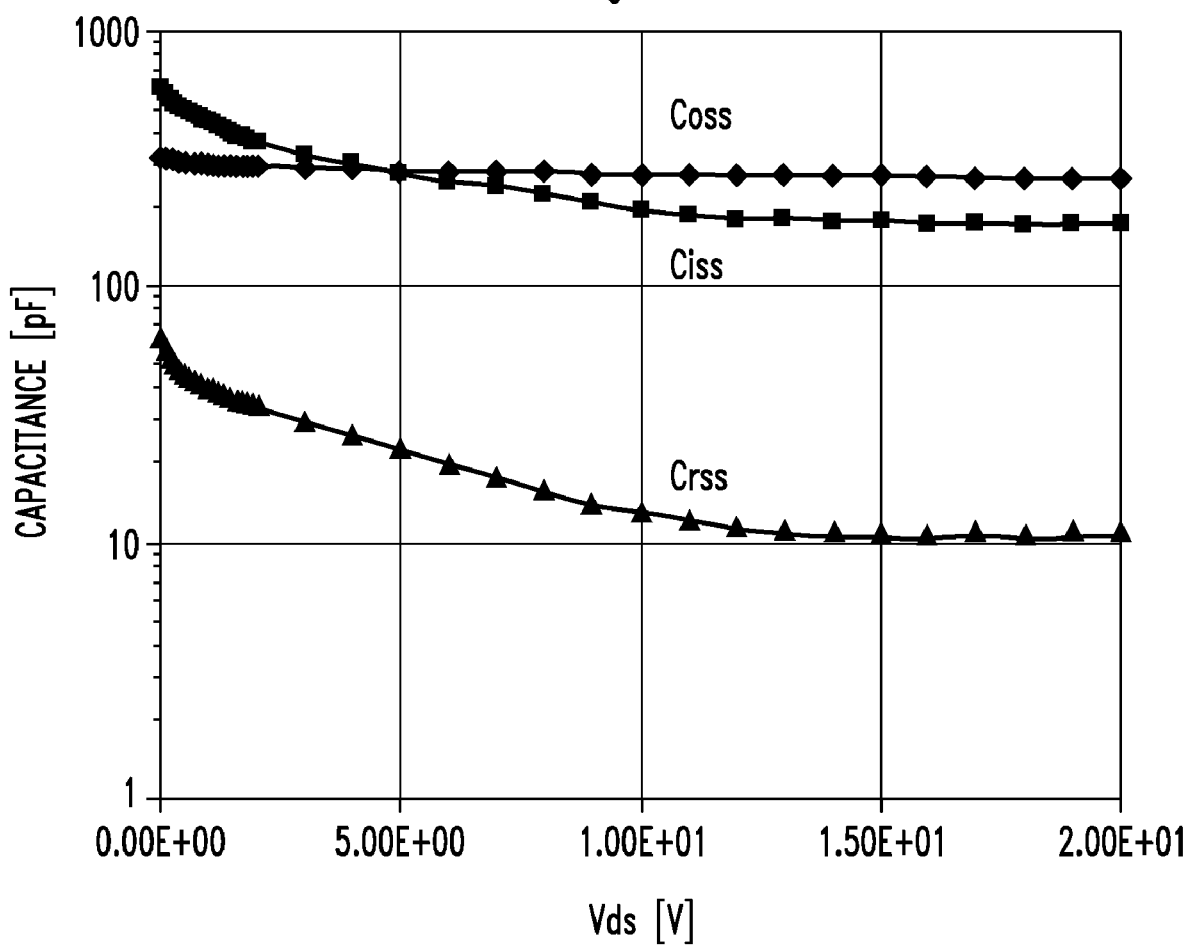

FIG. 9 shows the capacitances Ciss, Coss and Crss as a function of the drain voltage, where Ciss is the input capacitance (Cgs+Cgd), Coss is the output capacitance (Cds+Cdg) and Crss is the feedback capacitance (Cdg). Cdg is very close to Cgd, depending on to what terminals the source signals are applied and at what terminals the response signals are measured. Generally speaking, the proposed device has smaller capacitances than the commercially available products. Particularly, the feedback capacitance Crss (approximately equal to Cgd) is smaller by a factor of 5 than similar existing power MOSFETS.

Figure 10:
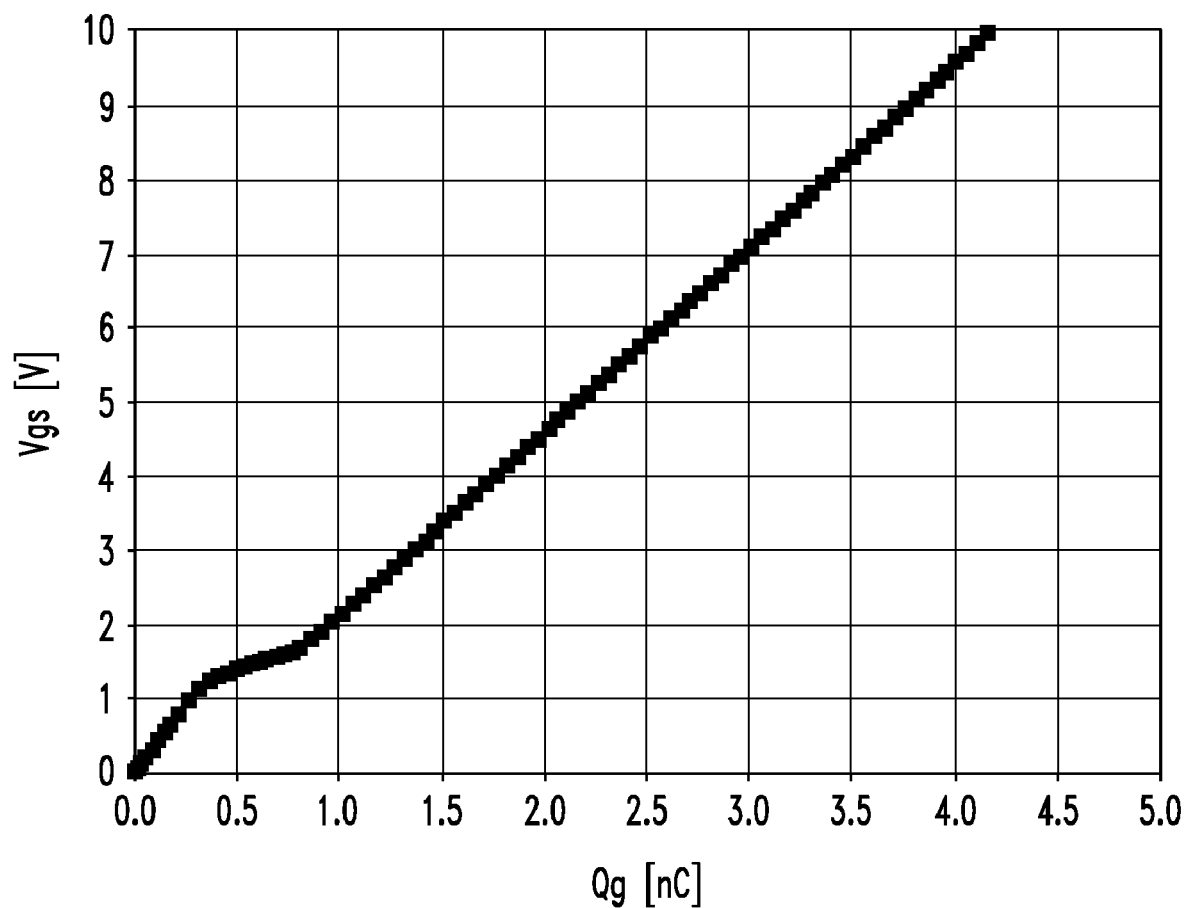

Finally, FIG. 10 shows a gate charge curve. It can be seen from the curve that that a gate voltage of 5V can be reached by charging the gate with only 2.2 nC/mm$^2$. This is a very low charge providing an accepted figure of merit of Rds (Vgs=10V)*Qg(VS=5V) of 22 mΩ*nC, whereas the similar devices in the art result in values higher than 50 mΩ*nC.

As set forth above, an improved power LDMOS device is provided having an n-channel transistor formed over a low resistance N-substrate. The device exhibits low on-resistance ($R_{ds-on}$) by lowering the resistive contribution of the substrate and low Cgd capacitance by minimizing the electrostatic coupling between the gate and drain electrodes. In embodiments, the source contact extends over gate and drain regions, thereby providing a high current capability.

Although the invention has been described in terms of exemplary embodiments, it is not limited thereto. Rather, the appended claims should be construed broadly to include other variants and embodiments of the invention that may be made by those skilled in the art without departing from the scope and range of equivalents of the invention.

What is claimed is:

1. A lateral metal-oxide-semiconductor transistor device comprising:
 a substrate having a first conductivity type and having a lightly doped epitaxial layer thereon having an upper surface;
 source and drain regions of the first conductivity type formed in the epitaxial layer proximate the upper surface, said source and drain regions being spaced from one another and having a channel region of a second conductivity type formed therebetween in said epitaxial layer, said channel region extending under said source region;
 a conductive gate formed over a gate dielectric layer formed over said channel region and partially overlapping said source and drain regions;
 a drain contact electrically connecting said drain region to said substrate and spaced from said channel region comprising:
  a first trench formed from the upper surface of said epitaxial layer to said substrate and having a side wall along said epitaxial layer;
  a highly doped region of said first conductivity type formed along said side wall of the first trench; and a drain plug in said first trench adjacent said highly doped region;

a source contact electrically connected to said source region and providing an electrical short between the source region and the channel region; and an insulating layer formed between said conductive gate and said source contact, wherein the transistor device further comprises a second trench formed adjacent said source and channel regions and extending into said channel region, wherein said second trench is formed partially through said epitaxial layer such that a bottom surface thereof is spaced from an upper surface of said substrate, wherein said insulating layer extends along sidewalls of said conductive gate, over said conductive gate and over said drain region, and wherein said source contact comprises a layer of conductive material deposited in said second trench and over said insulating layer.

2. The device of claim 1, wherein said layer of conductive material has a generally planar upper surface and covers said conductive gate and drain region.

3. The device of claim 1, wherein said insulating layer has a thickness between about 0.05 to 0.15 μm over said drain region, whereby said layer of conductive material shields said conductive gate from said drain contact.

4. The device of claim 1, wherein said insulating layer comprises a first portion over said drain region and a second portion over said drain plug, said second portion being thicker than said first portion.

5. The device of claim 4, wherein said first portion has a thickness between about 0.05 to 0.15 μm and said second portion has a thickness between about 0.2 to 0.5 μm.

6. The device of claim 1, wherein said insulating layer has a thickness along sidewalls of said conductive gate greater than about 0.03 μm and a thickness over a top surface of said conductive gate greater than about 0.05 μm.

7. The device of claim 1, further comprising a highly doped region of said second conductivity type formed in said channel region proximate a bottom of said second trench.

8. The device of claim 1, further comprising an edge termination region surrounding the active area of said transistor and separating said transistor from an edge of a die having said transistor formed thereon, said edge termination region comprising a well region of the second conductivity type formed in said epitaxial layer, wherein said layer of conductive material extends beyond said well region and over said insulating layer; and wherein said drain plug is formed at or proximate to said edge of the die.

9. The device of claim 1, wherein said substrate is a non-epitaxial silicon substrate and said epitaxial layer is a silicon epitaxial layer, further comprising a first buffer region of said second conductivity type formed in said epitaxial layer between said substrate and said channel region, said first buffer region having a conductivity greater than or equal to the conductivity of said channel region.

10. The device of claim 9, further comprising a second buffer region of said first conductivity type formed in said epitaxial layer between said first buffer region and said substrate.

11. The device of claim 10, wherein said first and second buffer regions are implant regions formed in said epitaxial layer.

12. The device of claim 1, wherein said drain plug comprises a conductive material.

13. The device of claim 1, wherein said drain plug comprises an insulating material.

14. The device of claim 1, wherein said substrate has a thickness of less than or about 76 μm.

15. The device of claim 1, wherein said first conductivity type is N conductivity type and said substrate has a highly doped concentration.

16. A lateral metal-oxide-semiconductor transistor device comprising:

a highly doped semiconductor substrate having a N conductivity type and having a lightly doped epitaxial layer thereon having an upper surface;

source and drain regions of the N conductivity type formed in the epitaxial layer proximate the upper surface, said source and drain regions being spaced from one another and having a channel region of a P conductivity type formed therebetween in said epitaxial layer, said channel region extending under said source region;

a conductive gate formed over a gate dielectric layer formed over said channel region and partially overlapping said source and drain regions;

at least one buffer layer having a dopant concentration equal to or greater than said channel region formed between said channel region and said substrate;

a drain contact electrically connecting said drain region to said substrate and spaced from said channel region comprising:

a first trench formed from the upper surface of said epitaxial layer to said substrate and having a side wall along said epitaxial layer;

a highly doped region of said N conductivity type formed along said side wall of the first trench; and a drain plug in said first trench adjacent said highly doped region;

an insulating layer extending along sidewalls of said conductive gate, over said conductive gate and over said drain region, said insulating layer comprising a first portion over said drain region and a second portion over said drain plug, said second portion being thicker than said first portion; and a source contact electrically connected to said source region and providing an electrical short between the source region and the channel region, said source contact comprising a layer of conductive material deposited over said insulating layer and in a second trench formed adjacent said source and channel regions and extending into said channel region, wherein said second trench is formed partially through said epitaxial layer such that a bottom surface thereof is spaced from an upper surface of said substrate.

17. The device of claim 16, wherein said at least one buffer region comprises first buffer region of said P conductivity type formed between said substrate and said channel region, and a second buffer region of said N conductivity type formed between said first buffer region and said substrate.

18. The device of claim 16, further comprising a highly doped region of said P conductivity type formed in said channel region proximate a bottom of said second trench.

19. The device of claim 16, further comprising an edge termination region surrounding the active area of said transistor and separating said transistor from an edge of a die having said transistor formed thereon, said edge termination region comprising a well region of the P conductivity type formed in said epitaxial layer, wherein said layer of conductive material extends beyond said well region and over said insulating layer; and wherein said drain plug is formed at or proximate to the edge of the die.

20. A lateral metal-oxide-semiconductor power transistor device comprising:
- a substrate having a first conductivity type having a lightly doped epitaxial layer thereon having an upper surface;
- source and drain regions of the first conductivity type formed in the epitaxial layer proximate the upper surface, said source and drain regions being spaced from one another and having a channel region of a second conductivity type formed therebetween in said epitaxial layer, said channel region extending under said source region;
- a conductive gate formed over a gate dielectric layer formed over said channel region and partially overlapping said source and drain regions;
- at least one buffer layer having a dopant concentration equal to or greater than said channel region formed between said channel region and said substrate;
- a drain contact electrically connecting said drain region to said substrate and spaced from said channel region comprising a highly doped vertical implant region of said first conductivity type formed in said epitaxial layer;
- a source contact electrically connected to said source region and providing an electrical short between the source region and the channel region, wherein the source contact is formed at least in part in a trench formed in said epitaxial layer, wherein a bottom surface of said trench is spaced from an upper surface of said substrate; and
- an insulating layer formed between said conductive gate and said source contact.

21. A lateral metal-oxide-semiconductor transistor device comprising:
- a highly doped substrate having a first conductivity type and having an epitaxial layer formed thereon;
- source and drain implant regions of the first conductivity type formed in the epitaxial layer, said source and drain regions being spaced from one another and having a channel region of a second conductivity type formed therebetween in said epitaxial layer, said channel region extending under said source region;
- a conductive gate formed over the channel region;
- a drain contact electrically connecting said drain region to said substrate through the epitaxial layer;
- an insulating layer formed over said conductive gate and on an upper surface of said epitaxial layer;
- a source metal layer deposited over said insulating layer and forming a source contact providing an electrical short between the source region and the channel region; and
- wherein said insulating layer comprises a first portion defined between said source metal layer and said drain implant region and a second portion defined between said drain plug and said source metal layer, wherein said second portion is thicker than said first portion.

22. The device of claim 21, wherein the first portion has a thickness between about 0.05 to 0.15 µm and said second portion has a thickness between about 0.2 to 0.5 µm.

23. The device of claim 21, wherein the first portion has a thickness between about 0.06 to 0.1 µm and said second portion has a thickness between about 0.2 to 0.3 µm.

24. A lateral metal-oxide-semiconductor transistor device comprising:
- a non-epitaxial, highly doped substrate having a first conductivity type;
- an epitaxial layer having an upper surface and a lower surface formed on said substrate and having an implant doping profile, said implant doping profile comprising:
  - source and drain implant regions of the first conductivity type formed proximate the upper surface of the epitaxial layer and spaced from one another,
  - a body implant region comprising a channel region of a second conductivity type formed therebetween, said channel region extending under said source implant region;
  - a first implant region having said second conductivity type implanted proximate to and underneath said channel region, said first implant region having a dopant concentration equal to or greater than a dopant concentration of said channel region, and
  - a second implant region having said first conductivity type implanted below said first implant region;
- a conductive gate and a gate dielectric layer formed over the channel region;
- a drain contact electrically connecting said drain implant region to said substrate through the epitaxial layer; and
- a source contact electrically connected to said source region and providing an electrical short between the source region and the channel region.

25. The device of claim 24, wherein said substrate is a silicon substrate and said epitaxial layer is a layer of epitaxially grown silicon.

* * * * *